(12) United States Patent
Murayama et al.

(10) Patent No.: US 8,026,576 B2
(45) Date of Patent: Sep. 27, 2011

(54) WIRING BOARD

(75) Inventors: Kei Murayama, Nagano (JP); Shinji Nakajima, Tsurugashima (JP)

(73) Assignees: Shinko Electric Industries Co., Ltd., Tokyo (JP); Asahi Kasei Microdevices Corporation, Tokyo (JP)

( * ) Notice: Subject to any disclaimer, the term of this patent is extended or adjusted under 35 U.S.C. 154(b) by 185 days.

(21) Appl. No.: 12/241,238

(22) Filed: Sep. 30, 2008

(65) Prior Publication Data
US 2009/0085164 A1 Apr. 2, 2009

(30) Foreign Application Priority Data
Oct. 1, 2007 (JP) .................................. 2007-257504

(51) Int. Cl.
*H01L 29/861* (2006.01)
(52) U.S. Cl. .. 257/603; 257/605; 257/606; 257/E29.335
(58) Field of Classification Search .................. 257/603, 257/605, E29.335, 606
See application file for complete search history.

(56) References Cited

U.S. PATENT DOCUMENTS

| | | | | |
|---|---|---|---|---|
| 4,484,206 | A * | 11/1984 | Moroshima et al. | 257/606 |
| 2004/0232517 | A1 * | 11/2004 | Furuhata | 257/520 |
| 2006/0255280 | A1 * | 11/2006 | Shibayama | 250/370.11 |
| 2007/0290329 | A1 * | 12/2007 | Murayama et al. | 257/704 |
| 2008/0036362 | A1 * | 2/2008 | Tanimoto et al. | 313/498 |

FOREIGN PATENT DOCUMENTS

| | | |
|---|---|---|
| JP | 05-109883 | 4/1993 |
| JP | 07-263452 | 10/1995 |
| JP | 7263452 | * 10/1995 |
| JP | 08139302 | * 5/1996 |
| JP | 11-162990 | 6/1999 |
| JP | 2004-273848 | 9/2004 |
| JP | 2007-042741 | 2/2007 |

* cited by examiner

*Primary Examiner* — Zandra Smith
*Assistant Examiner* — Jamie C Niesz
(74) *Attorney, Agent, or Firm* — Rankin, Hill & Clark LLP

(57) ABSTRACT

There is provided a wiring board. The wiring board includes: a semiconductor substrate having a through hole and covered with an insulating film; a through electrode formed in the through hole; a first wiring connected to one end of the through electrode; and a second wiring connected to the other end of the through electrode. The semiconductor substrate includes: a semiconductor element and a first guard ring formed to surround the through hole. The semiconductor element includes a first conductivity-type impurity diffusion layer having a different conductivity-type from that of the semiconductor substrate and is electrically connected to the first wiring and the second wiring.

10 Claims, 17 Drawing Sheets

WIRING BOARD

This application is based on and claims priority from Japanese Patent Application No. 2007-257504, filed on Oct. 1, 2007, the entire contents of which are hereby incorporated by reference.

BACKGROUND OF THE INVENTION

1. Technical Field

The present disclosure relates to a wiring board including a through electrode passing through a semiconductor substrate and being insulated from the semiconductor substrate and a wiring connected to one end of the through electrode and being electrically connected to an electronic component.

2. Related Art

A wiring board 200 shown in FIG. 1 has hitherto been used as a re-wiring board (an interposer) for electrically connecting a semiconductor chip to a mounting board such as a mother board.

FIG. 1 is a cross-sectional view of a wiring board in the related-art.

By reference to FIG. 1, the related-art wiring board 200 includes a semiconductor substrate 206 corresponding to a base-body, an insulating film 207, through electrodes 208, and wirings 211 and 212.

The semiconductor substrate 206 is a plate-like silicon substrate having through holes 215. Specifically, an n-type silicon substrate or a p-type silicon substrate is used as the semiconductor substrate 206. The insulating film 207 is provided so as to cover almost the overall surface of the semiconductor substrate 206 including an upper surface 206A, a lower surface 206B, and portions of the semiconductor substrate 206 exposed from the through holes 215.

The through electrodes 208 are electrodes for electrically connecting the wirings 211 to the wirings 212 and provided so as to fill the through holes 215 on which the insulating film 207 is formed. Cu may be used as a material for the through electrodes 208, for example. The wirings 211 are provided so as to extend from upper ends of the respective through electrodes 208 to the insulating film 207 formed on the upper surface 206A of the semiconductor substrate 206. The wirings 211 are wirings electrically connected to an electronic component 201 (e.g., a semiconductor chip).

The wirings 212 are provided so as to extend from lower ends of the respective through electrodes 208 to a lower surface of the insulating film 207 formed on the lower surfaces 206B of the semiconductor substrate 206. The wirings 212 are wires electrically connected to pads 203 of a mounting board 202 (e.g., a mother board) (see e.g., JP-A-2007-42741).

In the wiring board 200 configured as mentioned above, when the semiconductor substrate 206 is made of silicon, a semiconductor element such as a diode or a transistor can be readily formed in the semiconductor substrate 206 by forming a p-type impurity diffusion layer and an n-type impurity diffusion layer therein. Further, when the impurity diffusion layers formed in the semiconductor substrate 206 and the electronic component 201 are electrically connected together, it is possible to protect the electronic component 201 and adjust characteristics of the electronic component 201 by the elements formed in the semiconductor substrate 206.

The wiring board 200 is different from a common semiconductor device in that the through holes 215 and the through electrodes 208 are formed in the semiconductor substrate 206. For this reason, in the related-art wiring board 200, there in a problem in that characteristics of elements formed in the semiconductor substrate 206 are deteriorated due to the through holes 215 and the through electrodes 208, more specifically, an increase in leakage current.

Specifically, for instance, when impurity concentration of the semiconductor substrate 206 is low (e.g., in case of impurity concentration being less than $1.0 \times 10^{17}$ ions/cm$^3$), an inversion layer is likely to be formed in the areas (hereinafter called "sidewalls") of the semiconductor substrate 206 corresponding to side surfaces of the through holes 215 on which the insulating film 207 is formed and areas (hereinafter called "sidewall areas") of the semiconductor substrate 206 located near the sidewalls. Thus, when the inversion layer is inductively formed in the sidewall areas surrounding the respective through electrodes 208 by a potential difference between the semiconductor substrate 206 and the through electrodes 208, the inversion layer is linked to the impurity diffusion layer, thus to increase an equivalent junction area between the impurity diffusion layer and the semiconductor substrate 206. This leads to an increase in a leakage current of the element.

The through holes 215 are generally formed by dry etching such as RIE. When the through holes 215 are formed by dry etching, it is known that a layer (a layer called a plasma-damaged layer or an etching-damaged layer) whose lattice structure is destroyed is formed in the sidewall areas surrounding the through holes 215. Further, when the through holes 215 are formed by dry etching, it is also known that a by-product such as Fluorocarbon adheres to the sidewalls surrounding the through holes 215. The damaged layer and the byproducts are naturally removed after dry etching. However, if they are insufficiently removed, the insulating film 207, which is to be formed in the through holes 215, is deteriorated as compared with the other areas in terms of insulation characteristics. As a result, if other factors, such as diffusion and intrusion of Cu from the through electrodes 208 or intrusion of contaminants (e.g., Fe, Na, K and the like) from the outside, further combines with deterioration of the insulation characteristics of the insulating film 207, a leak current is generated in an area of the insulating film 207 subjected to diffusion of Cu or intrusion of contaminants (e.g., Fe, Na, K, and the like) from the outside. This leads to an increase in the leakage current of the element.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of exemplary embodiments of the present invention to provide a wiring board capable of preventing characteristic deterioration of a semiconductor element formed in a semiconductor substrate.

According to one or more aspects of the present invention, there is provided a wiring board. The wiring board includes: a semiconductor substrate having a through hole and covered with an insulating film; a through electrode formed in the through hole; a first wiring connected to one end of the through electrode; and a second wiring connected to the other end of the through electrode. The semiconductor substrate includes: a semiconductor element including a first conductivity-type impurity diffusion layer having a different conductivity-type from that of the semiconductor substrate and electrically connected to the first wiring and the second wiring; and a first guard ring formed to surround the through hole.

According to one or more aspects of the present invention, there is provided a semiconductor device. The semiconductor device includes the wiring board; and an electronic component mounted on the wiring board.

According to one or more aspects of the present invention, there is provided a method of manufacturing a wiring board. The method includes: (a) providing a semiconductor substrate; (b) forming a first impurity diffusion layer having a different conductivity type from that of the semiconductor substrate, in the semiconductor substrate; (c) forming a first conductivity-type impurity diffusion layer in the semiconductor substrate such that the first impurity diffusion layer surrounds an outer periphery of the first conductivity-type impurity diffusion layer, while forming a first guard ring in the semiconductor substrate; (d) forming a through hole in the semiconductor substrate such that the through hole is surrounded by the first guard ring; (e) forming an insulating film to cover the whole surface of the semiconductor substrate; (f) forming a through electrode in the through hole; (g) forming openings in the insulating film to expose the first conductivity-type impurity diffusion layer and a portion of the semiconductor substrate opposite to the first conductivity-type impurity diffusion layer; (h) forming a first wiring connected to one end of the through electrode, on the semiconductor substrate; and (i) forming a second wiring connected to the other end of the through electrode, on the semiconductor substrate.

According to the present invention, when the impurity concentration of the semiconductor substrate is low to such an extent that an inversion layer is generated within the semiconductor substrate by a potential difference between the through electrodes and the semiconductor substrate upon applying power, the first guard ring is formed so as to have the same conductivity type as that of the semiconductor substrate. In this case, generation of the inversion layer is prevented by the first guard ring formed to surround side surfaces of the through electrode. Further, it can be prevented that the inversion layer generated around the through electrode is electrically connected to the first conductivity-type impurity diffusion layer. Thus, an increase in leakage current is suppressed, and hence characteristic deterioration of a semiconductor element formed in the semiconductor substrate can be prevented.

When the impurity concentration of the semiconductor substrate is high to such an extent that an inversion layer is not generated within the semiconductor substrate by a potential difference between the through electrode and the semiconductor substrate upon applying power, the first guard ring is generated so as to have a conductivity type different from that of the semiconductor substrate. In this case, the first guard ring formed to surround side surfaces of the through electrode generate a PN junction between the first guard ring and the semiconductor substrate, and a depletion layer is likely to be generated in areas of the semiconductor substrate surrounding the through electrode. Thus, an increase in leakage current is prevented, and hence characteristic deterioration of a semiconductor element formed in the semiconductor substrate can be prevented.

A second guard ring that surrounds the semiconductor element, the through electrode and the first guard ring may also be provided in the semiconductor substrate on the side on which the wirings are formed. As a result, the second guard ring serves to getter contaminants intruding from cutting surfaces of the wiring board, and hence an increase in leakage current and characteristic deterioration of the semiconductor element formed in the semiconductor substrate can be prevented.

Other aspects and advantages of the present invention will be apparent from the following description, the drawings, and the claims.

DETAILED DESCRIPTION OF EXEMPLARY
EMBODIMENTS OF THE INVENTION

Exemplary embodiments of the present invention will be described with reference to the drawings hereinafter.

First Embodiment

Figure 1:
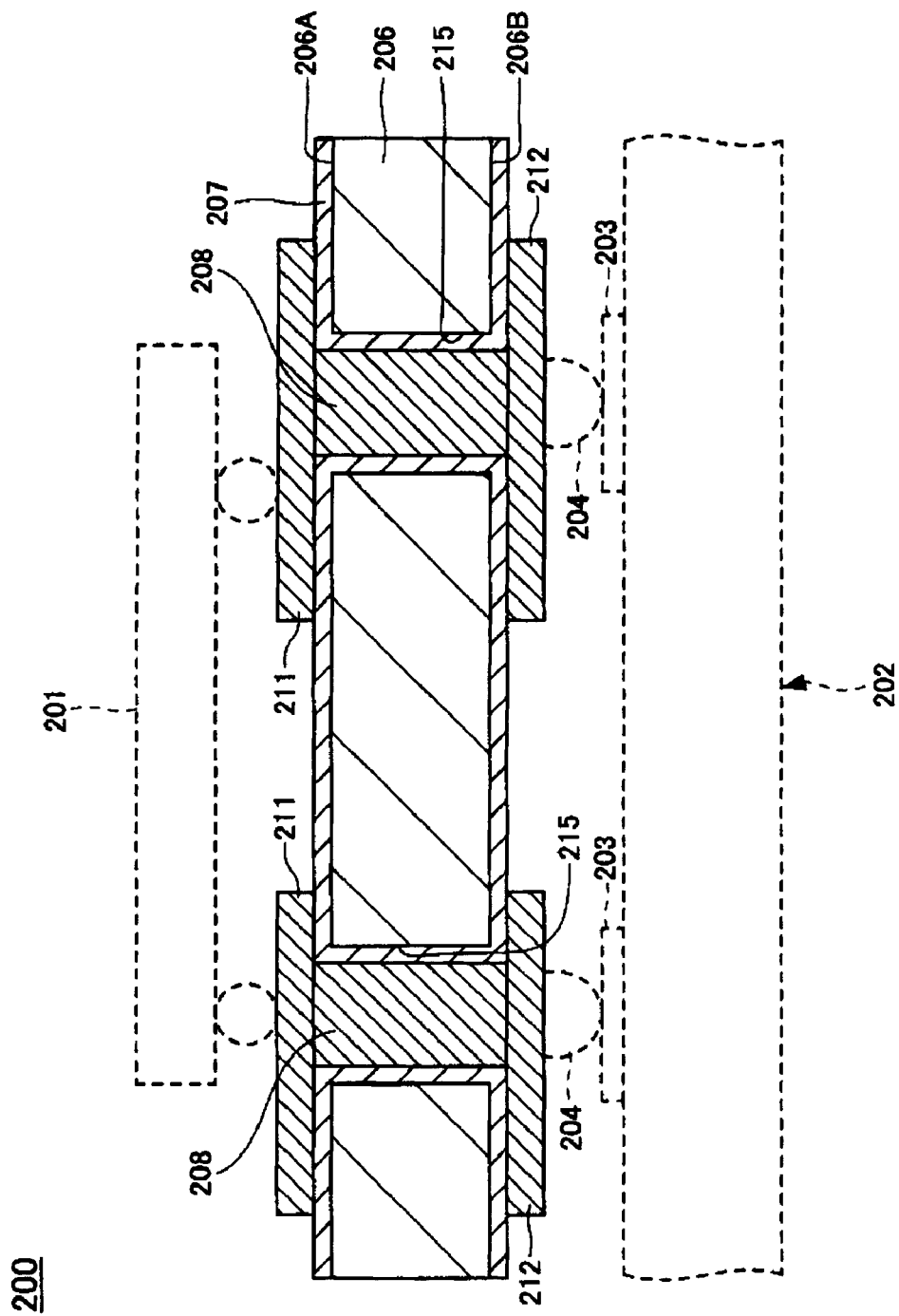
FIG. 1 is a cross-sectional view of a wiring board in the related art.
Figure 2:
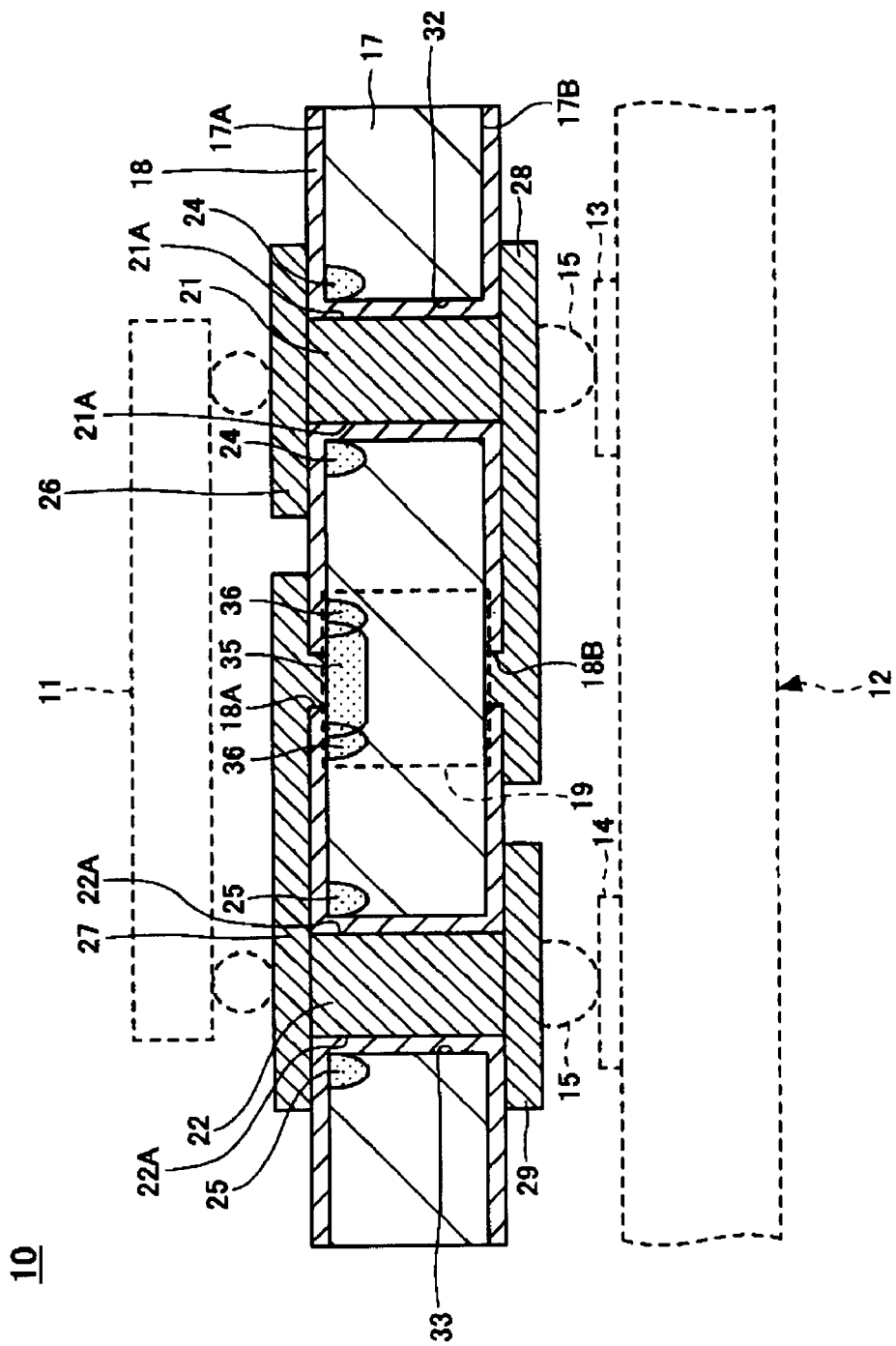
FIG. 2 is a cross-sectional view of a wiring board according to a first embodiment of the present invention.

FIG. 2 is a cross-sectional view of a wiring board according to a first embodiment of the present invention.

By reference to FIG. 2, a wiring board 10 of a first embodiment includes: a semiconductor substrate 17; an insulating film 18; a Zener diode 19 serving as a semiconductor element;

through electrodes 21 and 22; first guard rings 24 and 25; wirings 26 and 27 serving as first wirings; and wirings 28 and 29 serving as second wirings.

The semiconductor substrate 17 is almost shaped like a rectangular thin board, and made of a semiconductor material such as silicon. The semiconductor substrate 17 has through holes 32 and 33 formed at predetermined locations thereon. Conditions for forming the semiconductor substrate 17, an impurity diffusion layer formed in the semiconductor substrate 17, guard rings, and the like, will be described later.

The insulating film 18 has an opening 18A through which an upper surface of a first conductivity type impurity diffusion layer 35 (described later) is exposed and an opening 18B through which a portion of a lower surface 17B of the semiconductor substrate 17 located under the first conductivity type impurity diffusion layer 35 is exposed. The insulating film 18 is provided so as to cover an upper surface 17A and the lower surface 17B of the semiconductor substrate 17 (but except areas where the openings 18A and 18B are to be formed) and surfaces of the semiconductor substrate 17 corresponding to side surfaces of the through holes 32 and 33. For instance, an oxide film (e.g., a thermal oxide film) having a thickness of about 2 µm can be used as the insulating film 18.

The Zener diode 19 is formed in the semiconductor substrate 17 and includes: the first conductivity type impurity diffusion layer 35; an impurity diffusion layer 36, serving as a first impurity diffusion layer; and a portion of the semiconductor substrate 17 located under the first conductivity type impurity diffusion layer 35. The first conductivity type impurity diffusion layer 35 is formed by diffusion and implantation of impurities, which differ from the semiconductor substrate 17 in a conductivity type. This diffusion and implantation is performed to a predetermined depth from the upper surface 17A of the semiconductor substrate 17 at a predetermined position on the semiconductor substrate 17 positioned away from the through holes 32 and 33.

The impurity diffusion layer 36 is formed by diffusing and implanting impurities from the upper surface 17A of the semiconductor substrate 17 to a predetermined depth so as to surround the first conductivity type impurity diffusion layer 35 along an outer periphery thereof. An upper surface of the first conductivity type impurity diffusion layer 35 is connected to a portion of the wiring 27 through the opening 18A. Further, the lower surface 17B of the semiconductor substrate 17 located under the first conductivity type impurity diffusion layer 35 is connected to a portion of the wiring 28 through the opening 18B.

The Zener diode 19 configured as mentioned above is connected in parallel to an electronic component 11 (e.g., a semiconductor chip).

The through electrode 21 fills the through hole 32 covered with the insulating film 18. An upper end of the through electrode 21 is almost flush with the insulating film 18 on the upper surface 17A of the semiconductor substrate 17. A lower end of the through electrode 21 is almost flush with the insulating film 18 on the lower surface 17B of the semiconductor substrate 17. The upper end of the through electrode 21 is connected to a portion of the wiring 26, and the lower end of the through electrode 21 is connected to a portion of the wiring 28. Thus, the through electrode 21 electrically connects the wiring 26 to the wiring 28.

The through electrode 22 fills the through hole 33 covered with the insulating film 18. An upper end of the through electrode 22 is almost flush with the insulating film 18 on the upper surface 17A of the semiconductor substrate 17. A lower end of the through electrode 22 is almost flush with the insulating film 18 on the lower surface 17B of the semiconductor substrate 17. The upper end of the through electrode 22 is connected to a portion of the wiring 27, and the lower end of the same is connected to a portion of the wiring 29. Thus, the through electrode 22 electrically connects the wiring 27 to the wiring 29. For example, the through electrodes 21 and 22 may be formed by filling the through holes 32 and 33 with Cu formed through deposition and growth by plating.

The first guard ring 24 is formed so as to surround the through hole 32 within the area of the semiconductor substrate 17 located inside of the insulating film 18, by diffusing and implanting impurities from the upper surface 17A of the semiconductor substrate 17 to a predetermined depth.

The first guard ring 25 is formed so as to surround the through hole 33 within the area of the semiconductor substrate 17 located inside of the insulating film 18, by diffusing and implanting impurities from the upper surface 17A of the semiconductor substrate 17 to a predetermined depth.

The wiring 26 is provided so as to extend from the upper end of the through electrode 21 to the insulating film 18 on the upper surface 17A of the semiconductor substrate 17. A portion of the wiring 26 on the insulating film 18 is formed so as to connect at least one of terminals of the electronic component 11 to the upper end of the through electrode 21. The wiring 26 serves to a conductor for electrically connecting the through electrode 21 to one of the terminals of the electronic component 11.

The wiring 27 is provided so as to extend from the upper end of the through electrode 22 to the insulating film 18 on the upper surface 17A of the semiconductor substrate 17 including the opening 18A. A portion of the wiring 27 corresponding to the area where the opening 18A is formed is formed to fill the opening 18A and bonded to the upper surface of the first conductivity type impurity diffusion layer 35. The portion of the wiring 27 on the insulating film 18 is formed so as to connect another one of the terminals of the electronic component 11 to the upper end of the through electrode 22 and the first conductivity type impurity diffusion layer 35. This wiring 27 serves to a conductor for electrically connecting the through electrode 22, the first conductivity type impurity diffusion layer 35, and the terminal of the electronic component 11.

The wiring 28 is provided so as to extend from the lower end of the through electrode 21 to the lower surface of the insulating film 18 on the lower surface 17B including the opening 18B. A portion of the wiring 28 corresponding to the area where the opening 18B is formed is formed to fill the opening 18B and bonded to the lower surface 17B of the semiconductor substrate 17. The portion of the wiring 28 on the lower surface of the insulating film 18 is formed so as to connect a pad 13 of a mounting board 12 to the lower end of the through electrode 21 and a portion of the semiconductor substrate 17 exposed through the opening 18B. Thus, this wiring 28 serves to a conductor for electrically connecting the through electrode 21, the semiconductor substrate 17, and the pad 13 of the mounting board 12.

The wiring 29 is provided so as to extend from the lower end of the through electrode 22 to the lower surface of the insulating film 18 on the lower surface 17B of the semiconductor substrate 17. The portion of the wiring 29 on the lower surface of the insulating film 18 is formed so as to connect a pad 14 of the mounting board 12 to the lower end of the through electrode 22. Thus, this wiring 29 serves to a conductor for electrically connecting the through electrode 22 to the pad 14 of the mounting board 12.

The above wirings 26 to 29 are formed of a composite conductor film into which a plurality of conductive metals such as Cu and the like are formed. Specifically, a Ti—Cu—

Ni—Au multilayer film may be used as the composite conductor film constituting the wirings 26 to 29. For example, the Ti—Cu—Ni—Au multilayer film may be formed by layering a Ti film deposited on the surface of the insulating film 18 (including the surface of the insulating film 18, the surface of the first conductivity type impurity diffusion layer 35 in the opening 18A, and the surface of the semiconductor substrate 17 in the opening 18B), a Cu film deposited on the surface of the Ti film, a Ni film covering the surface of the Cu film, and an Au film for surface protection covering the surface of the Ni film (the surface of the Cu film).

Figure 3:
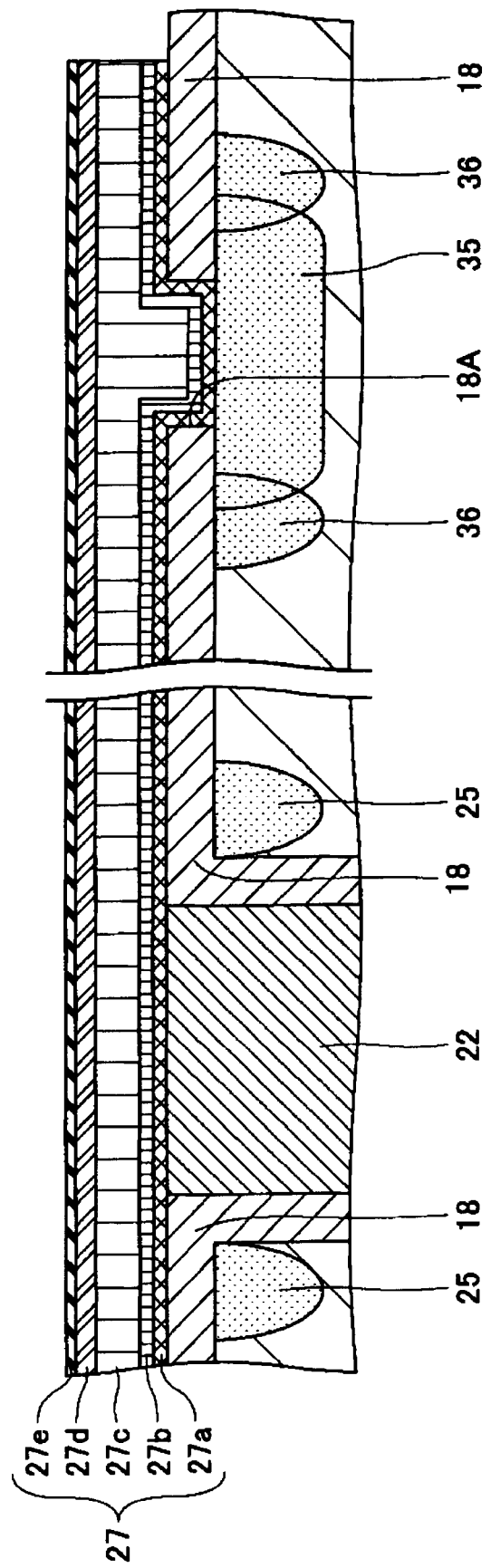
FIG. 3 is a view to describe the configuration of wirings to which electronic components are to be connected.

FIG. 3 is a view for explaining the structure of the wirings to which the electronic component is to be connected.

By reference to FIG. 3, a method of forming the Ti—Cu—Ni—Au multilayer film is described by taking the wiring 27 as an example.

As shown in FIG. 3, a Ti film 27a (a thickness of about 0.1 μm, for example) serving as a base coat is deposited by sputtering at a formation area of the wiring 27 including the surface of the insulating film 18, the upper end of the through electrode 22, and the surface of the first conductivity type impurity diffusion layer 35 in the opening 18A. Next, a Cu film 27b (a thickness of about 0.5 μm, for example) is deposited on the surface of the Ti film 27a by sputtering and then a Cu film 27c (a thickness of about 5.0 μm, for example) is thickly deposited on the Cu film 27b by plating. Subsequently, a Ni film 27d (a thickness of about 3.0 μm, for example) is deposited on the surface of the Cu film 27c by plating. Finally, an Au film 27e (a thickness of about 0.05 μm, for example) for surface protection is deposited on the surface of the Ni film 27d by plating. Thus, the wiring 27 is formed. The wirings 26, 28, and 29 are also formed by the same technique as that mentioned above.

In the wiring board 10 configured as mentioned above, when a p-type silicon substrate is used as the semiconductor substrate 17, the first conductivity type impurity diffusion layer 35 and the impurity diffusion layer 36 are formed by doping the semiconductor substrate 17 with n-type impurity. On the contrary, when an n-type silicon substrate is used as the semiconductor substrate 17, the first conductivity type impurity diffusion layer 35 and the impurity diffusion layer 36 are formed by doping the semiconductor substrate 17 with p-type impurity. At this time, the impurity diffusion layer 36 is formed so as to have an impurity concentration that is lower than that of the first conductivity type impurity diffusion layer 35. Occurrence of a local yield phenomenon near corners of the first conductivity type impurity diffusion layer 35 can be hereby prevented.

Specifically, when the semiconductor substrate 17 is a p-type semiconductor, a silicon substrate doped with B (boron) such that the concentration of p-type impurity is in a range of $1.0 \times 10^{18}$ to $1.0 \times 10^{20}$ ions/cm$^3$ may be used as the semiconductor substrate 17. In this case, the first conductivity type impurity diffusion layer 35 is formed by doping the upper surface 17A of the semiconductor substrate 17 to a depth of about 2 μm with P (phosphor), As (arsenic), or Sb (antimony) such that the n-type impurity concentration is in a range of $1.0 \times 10^{18}$ to $1.0 \times 10^{20}$ ions/cm$^3$. Further, the impurity diffusion layer 36 is formed by doping the upper surface 17A of the semiconductor substrate 17 to a depth of about 2 μm with P (phosphor), As (arsenic), or Sb (antimony) such that the n-type impurity concentration is in a range of $1.0 \times 10^{17}$ to $1.0 \times 10^{19}$ ions/cm$^3$.

On the contrary, when the semiconductor substrate 17 is an n-type semiconductor, a silicon substrate doped with P (phosphor), As (arsenic), or Sb (antimony) such that the n-type impurity concentration is in a range of to $1.0 \times 10^{18}$ to $1.0 \times 10^{20}$ ions/cm$^3$ may be used as the semiconductor substrate 17. In this case, the first conductivity type impurity diffusion layer 35 is formed by doping the upper surface 17A of the semiconductor substrate 17 to a depth of about 2 μm with boron (B) such that the p-type impurity concentration is in a range of $1.0 \times 10^{18}$ to $1.0 \times 10^{20}$ ions/cm$^3$. Further, the impurity diffusion layer 36 is formed by doping the upper surface 17A of the semiconductor substrate 17 to a depth of about 2 μm with boron (B) such that the p-type impurity concentration is in a range of $1.0 \times 10^{17}$ to $1.0 \times 10^{19}$ ions/cm$^3$.

When a semiconductor element to be formed in the semiconductor substrate 17 is a Zener diode, a specific numerical value of the impurity concentration of the semiconductor substrate 17 and a specific numerical value of the impurity concentration of the first conductivity type impurity diffusion layer 35 are determined in conformance with a required Zener voltage Vz and other conditions (e.g., processing conditions of a manufacturing system, and the like).

The semiconductor substrate 17 may also be different from a silicon substrate having almost a constant impurity concentration in any areas.

Figure 4:
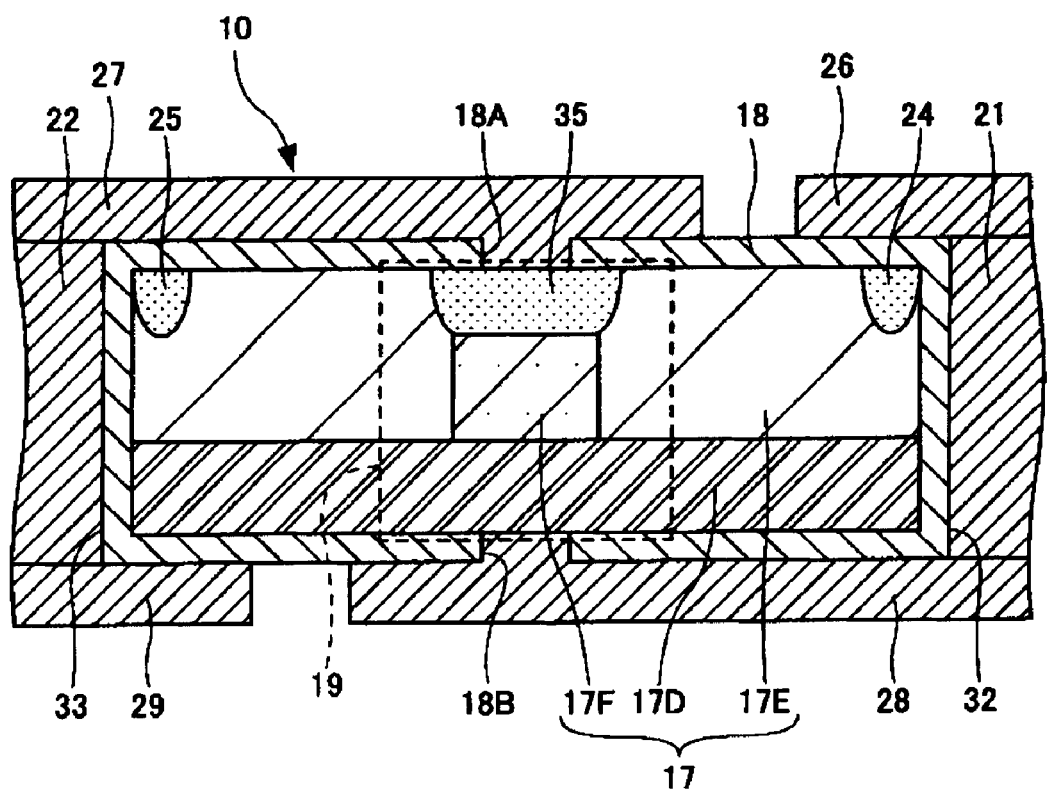
FIG. 4 is a schematic cross-sectional view showing an example of distribution of impurity concentration in a semiconductor substrate.

FIG. 4 is a schematic cross-sectional view showing an example of impurity concentration distribution in the semiconductor substrate.

For instance, as shown in FIG. 4, an n-type silicon substrate or a p-type silicon substrate including an epitaxial layer 17E with a low impurity concentration formed on a base layer 17D with a high impurity concentration and a high-concentration impurity diffusion region 17F formed at a predetermined area in the epitaxial layer 17E can also be used as the semiconductor substrate 17. The base layer 17D, the epitaxial layer 17E, and the high-concentration impurity diffusion region 17F are of the same conductivity type. A specific impurity concentration of the base layer 17D and the high-concentration impurity diffusion region 17F can be set to $1.0 \times 10^{18}$ to $1.0 \times 10^{20}$ ions/cm$^3$, and a specific impurity concentration of the epitaxial layer 17E can be set to less than $1.0 \times 10^{17}$ ions/cm$^3$. When an n-type semiconductor substrate is used as a conductivity type of the semiconductor substrate 17, the base layer 17D, the epitaxial layer 17E, and the high-concentration impurity diffusion region 17F are doped with B, respectively. When a p-type semiconductor substrate is used as the conductivity type of the semiconductor substrate 17, the base layer 17D, the epitaxial layer 17E, and the high-concentration impurity diffusion region 17F are doped with any of P, As, and Sb, respectively. When the epitaxial layer 17E is formed on the base layer 17D, an epitaxial growth technique may be used, for example. Further, upon forming the high-concentration impurity diffusion region 17F in the epitaxial layer 17E, an ion implantation technique may be used, for example.

When the semiconductor substrate 17 has a structure shown in FIG. 4, the first conductivity type impurity diffusion layer 35 is substantially formed just above the high-concentration impurity diffusion region 17F. When the area of the high-concentration impurity diffusion region 17F is almost equal to or smaller than the area of the first conductivity type impurity diffusion layer 35 at a junction portion between the high-concentration impurity diffusion region 17F and the first conductivity type impurity diffusion layer 35, the impurity diffusion layer 36 may not be formed.

Conditions for forming the guard rings 24 and 25 are determined in accordance with the impurity concentration of the semiconductor substrate 17. Specifically, the conditions are determined in accordance with the impurity concentration of surrounding areas of the through electrode 22 or the impurity concentration of an area located just below the wiring 27. The surrounding areas of the through electrode 22 and the area of the semiconductor substrate 17 located just below the wiring 27, where the impurity concentration poses a problem, correspond to the semiconductor substrate 17 in the case of the semiconductor substrate 17 whose impurity concentration shown in FIG. 2 is almost uniform and correspond to the epitaxial layer 17E in the case of the semiconductor substrate 17 whose impurity concentration shown in FIG. 4 is not uniform.

When the impurity concentration of the surrounding areas of the through electrode 22 and the impurity concentration of the area of the semiconductor substrate 17 corresponding to the area located just below the wiring 27 are low and when an inverse layer is inductively formed in the surrounding areas of the through electrodes 22 and the area of the semiconductor substrate 17 located just below the wiring 27 by a potential difference between the semiconductor substrate 17 and the through electrode 22 when applying power (in a case where the impurity concentration is lower than $1.0 \times 10^{17}$ ions/cm$^3$), the first guard rings 24, 25 have the same conductivity type as that of the semiconductor substrate 17 and are formed to have an impurity concentration higher than that of the semiconductor substrate 17.

The first guard rings 24 and 25 thus formed prevent linkage of the first conductivity type impurity diffusion layer 35 to the inversion layer formed on sidewalls surrounding the through electrode 22 by way of a surface layer of the semiconductor substrate 17 opposite to the wiring 27. By means of actions of the first guard rings 24 and 25, an increase in an equivalent junction area between the first conductivity type impurity diffusion layer 35 and the semiconductor substrate 17 is prevented, and thus an increase in leakage current can be prevented. The equivalent junction area between the first conductivity type impurity diffusion layer 35 and the semiconductor substrate 17 is more accurately the area of a PN junction between an n(p)-type region including the first conductivity type impurity diffusion layer 35 and the inversion layer, which are to be brought into electrical connection with the wiring 27, and a p(n)-type region of the semiconductor substrate 17 to be brought into electrical connection with the wiring 28.

Specifically, when the semiconductor substrate 17 is of a type "p" doped with a dopant B (boron) and when the p-type impurity concentration of the semiconductor substrate 17 is equal to or less than $1.0 \times 10^{17}$ ions/cm$^3$, the first guard rings 24 and 25 are formed by the same dopant (i.e., B (boron)) such that p-type impurity concentration is in a range of $1.0 \times 10^{18}$ to $1.0 \times 10^{20}$ ions/cm$^3$. When the semiconductor substrate 17 is of a type "n" doped with any of P (phosphor), As (arsenic), and Sb (antimony) and when the n-type impurity concentration is equal to or less than $1.0 \times 10^{17}$ ions/cm$^3$, the first guard rings 24, 25 are formed of the same impurity dopant such that the n-type impurity concentration is in a range of $1.0 \times 10^{18}$ to $1.0 \times 10^{20}$ ions/cm$^3$. The depth of the first guard rings 24 and 25 is almost equal to that of the first conductivity type impurity diffusion layer 35 and the impurity diffusion layer 36. Specifically, the depth of the first guard rings 24 and 25 can be set to 2 µm, for example.

In the meantime, the first guard rings 24 and 25 are formed to have a conductivity type different from that of the semiconductor substrate 17 in a case where the impurity concentration of the surrounding area of the through electrode 22 and the impurity concentration of the area of the semiconductor substrate 17 corresponding to the area located just below the wiring 27 are high, and in a case where an inversion layer is not inductively formed by a potential difference between the semiconductor substrate 17 and the through electrode 22 when applying power, in the surroundings of the through electrodes 22 and the area of the semiconductor substrate 17 corresponding to the area located just below the wiring 27 (in a case where the impurity concentration is higher than $1.0 \times 10^{18}$ ions/cm$^3$).

A PN junction is formed between the first guard rings 24 and 25 thus formed and the semiconductor substrate 17. With formation of the PN junction, the first guard rings 24, 25 facilitate formation of a depletion layer in the area of the semiconductor substrate 17 near the first guard rings 24 and 25.

For instance, when a potential difference is generated between the through electrode 22 and the semiconductor substrate 17 upon applying power, a depletion layer is formed near the guard ring 25, where formation of a depletion layer is facilitated, and also is formed near the surfaces (sidewalls) of the semiconductor substrate 17 opposing to the through electrode 22 via the insulating film 18. In this case, a PN junction and a depletion layer are partially or entirely interposed between the semiconductor substrate 17 and the insulating film 18.

A location on the insulating film 18 in the through hole 33, where insulation characteristic will be decreased with the highest probability, is a neighborhood of the upper surface 17A of the semiconductor substrate 17, which is exposed to plasma for the longest period of time during etching. In the meantime, the guard ring 24 is inevitably formed on the upper surface 17A of the semiconductor substrate 17 through common processes for manufacturing a semiconductor device. Therefore, when the guard ring 24 is provided, current leakage from the through electrode 22 to the semiconductor substrate 17 (or vice versa) by way of an area of the insulating film 18 whose insulation characteristic is deteriorated is inhibited by the PN junction or the depletion layer resulting from provision of the guard ring 24, so that an increase in the leakage current of the element 19 can be prevented.

Specifically, when the semiconductor substrate 17 is of a type "p" doped with a dopant B (boron) and when the p-type impurity concentration of the semiconductor substrate 17 is equal to or more than $1.0 \times 10^{18}$ ions/cm$^3$, the first guard rings 24 and 25 are formed to have the same dopant (i.e., P (phosphor), As (arsenic), or Sb (antimony)) such that the n-type impurity concentration is in a range of $1.0 \times 10^{17}$ to $1.0 \times 10^{20}$ ions/cm$^3$. When the semiconductor substrate 17 is of an "n" type doped with any of P (phosphor), As (arsenic), and Sb (antimony), the first guard rings 24, 25 are formed from the dopant B (boron) such that the p-type impurity concentration is in a range of $1.0 \times 10^{17}$ to $1.0 \times 10^{20}$ ions/cm$^3$. The depth of the first guard rings 24 and 25 is almost equal to that of the first conductivity type impurity diffusion layer 35 and the impurity diffusion layer 36. Specifically, the depth of the first guard rings 24 and 25 can be set to about 2 µm, for example.

According to the wiring board of the present embodiment, when the impurity concentration of the semiconductor substrate 17 is low to such an extent that an inversion layer is formed in the semiconductor substrate 17 by a potential difference between the through electrodes 21 and 22 and the semiconductor substrate 17 when applying power, the first guard rings 24 and 25 are formed to have the same conductivity type as that of the semiconductor substrate 17. In this case, formation of the inversion layer can be prevented by the first guard rings 24, 25 provided to surround side surfaces of the through electrodes 21, 22, and also it can be prevented that the inversion layer formed around the through electrodes 21, 22 is electrically connected to the first conductivity type impurity diffusion layer 35. An increase in leakage current is hereby prevented, and hence characteristic deterioration of a semiconductor element formed in the semiconductor substrate 17 can be prevented.

When the impurity concentration of the semiconductor substrate 17 is high to such an extent that an inversion layer is not formed in the semiconductor substrate 17 by a potential difference between the through electrodes 21 and 22 and the semiconductor substrate 17 when applying power, the first guard rings 24 and 25 are formed to have a conductivity type different from that of the semiconductor substrate 17. In this case, a PN junction is formed between the first guard rings 24, 25 provided to surround side surfaces of the through electrodes 21, 22 and the semiconductor substrate 17, and also a depletion layer is likely to be formed in areas of the semiconductor substrate 17 surrounding the through electrodes 21 and 22. This serves to prevent an increase in leakage current, and hence characteristic deterioration of a semiconductor element formed in the semiconductor substrate 17 can be prevented.

The exemplary embodiment of the present invention has been described by taking, as an example, a case where a semiconductor element (specifically the Zener diode 19) for protecting the electronic component 11 is used as an element to be formed in the semiconductor substrate 17. However, a semiconductor element for adjusting a characteristic of the electronic component 11 may also be provided on the semiconductor substrate 17 in place of the semiconductor element for protecting the electronic component. For example, a regulator for regulating a voltage of the electronic component 11 can also be used as the semiconductor element for adjusting the characteristic of the electronic component 11.

FIGS. 5 through 13 are views showing processes for manufacturing the wiring board according to the first embodiment of the present invention. In FIGS. 5 through 13, those components that are the same as those of the wiring board 10 according to the first embodiment are assigned the same reference numerals.

Figure 5:
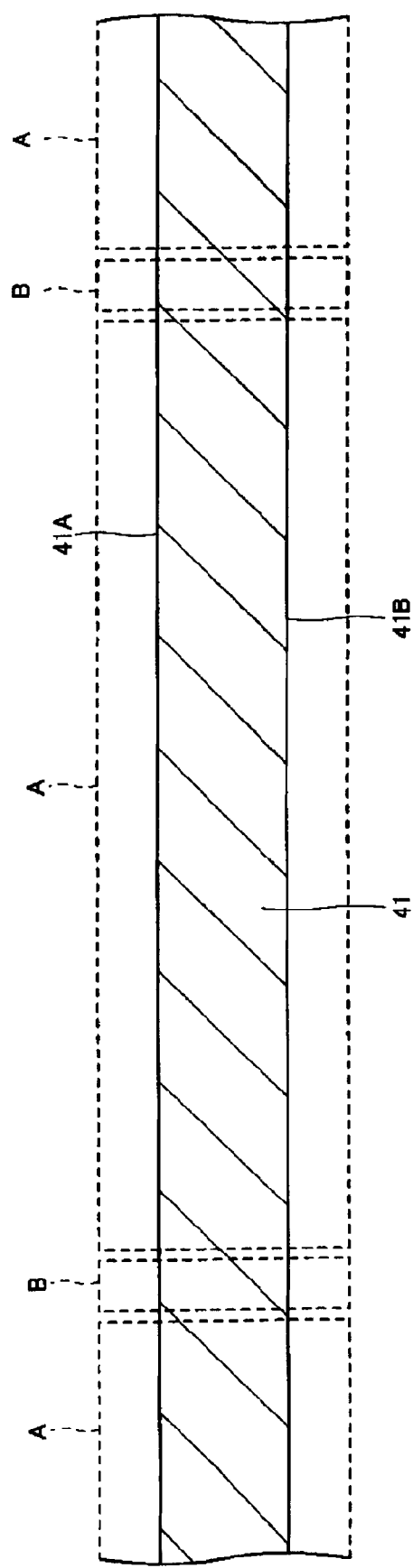
FIG. 5 is a view (part 1) showing a process of manufacturing the wiring board according to the first embodiment of the present invention.

Firstly, in the process shown in FIG. 5, a semiconductor substrate 41 is prepared which has a plurality of wiring board formation regions A where the wiring boards 10 are to be formed and cutoff regions B provided to surround the respective wiring board formation regions A. The cutoff regions B are areas to be cut by a dicing blade after structures equivalent the wiring boards 10 are formed in the wiring board formation regions A. Structures equivalent to the wiring boards 10 are formed in processes subsequent to the current process and cut along the cutoff regions B, whereby the semiconductor substrate 41 is divided into the plurality of semiconductor substrates 17 (see FIG. 2). A p-type silicon substrate or an n-type silicon substrate is used as the semiconductor substrate 41. The following descriptions will be given by means of taking, as an example, the case where an n-type silicon substrate (a thickness of about 200 μm) formed by doping monocrystal silicon with As such that the n-type impurity concentration is set to $1.0 \times 10^{18}$ ions/cm$^3$ is used as the semiconductor substrate 41.

Figure 6:
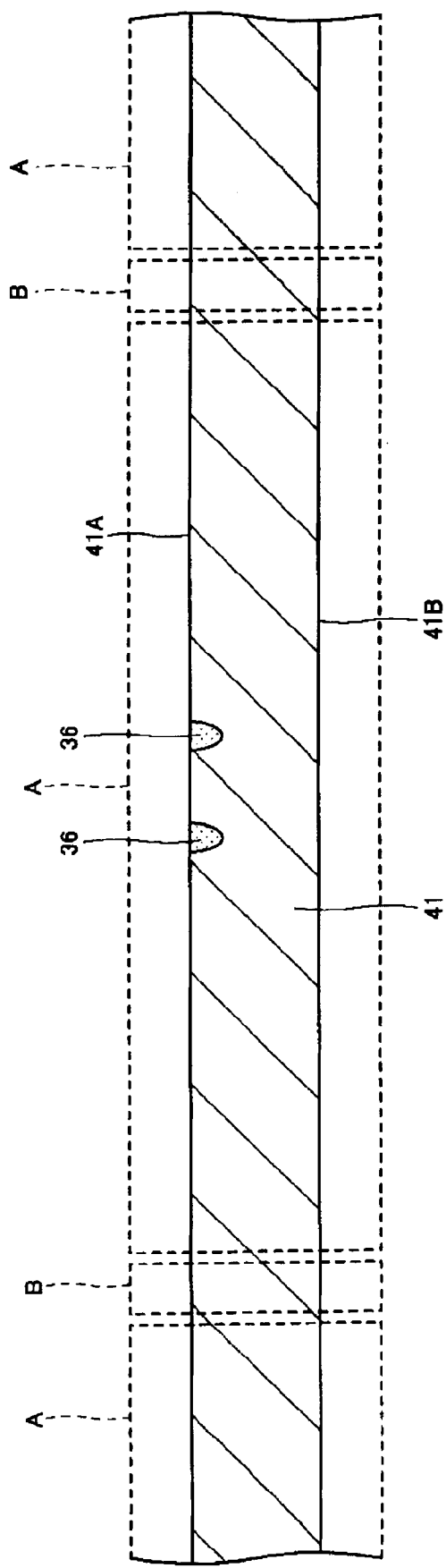
FIG. 6 is a view (part 2) showing a process of manufacturing the wiring board according to the first embodiment of the present invention.

Next, in a process shown in FIG. 6, the impurity diffusion layer 36 is formed by doping the semiconductor substrate 41, from the upper surface 41A of the semiconductor substrate 41, with a conductivity type impurity different from that of the semiconductor substrate 41. Specifically, when the semiconductor substrate 41 is an n-type silicon substrate, the substrate is doped with B, from the direction of the upper surface 41A of the semiconductor substrate 41, such that the p-type impurity concentration is set to about $1.0 \times 10^{17}$ ions/cm$^3$. Thus, the impurity diffusion layer 36 is formed in the semiconductor substrate 41. At this time, the depth of the impurity diffusion layer 36 can be set to about 2 μm, for example.

Figure 7:
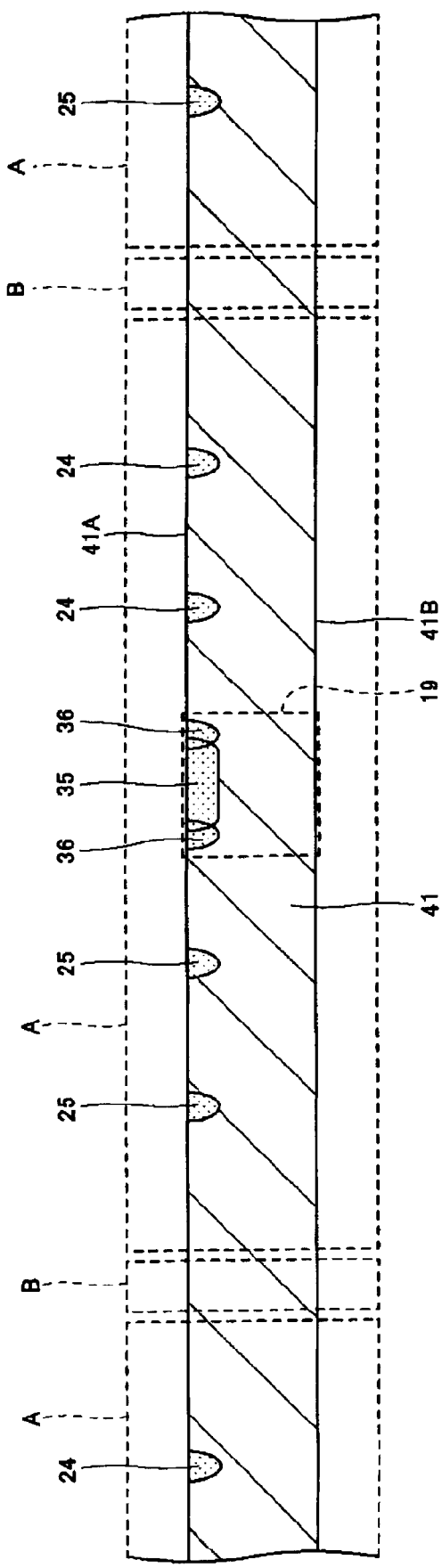
FIG. 7 is a view (part 3) showing a process of manufacturing the wiring board according to the first embodiment of the present invention.

In a process shown in FIG. 7, the semiconductor substrate is doped with the same conductivity type impurity as that of the impurity diffusion layer 36, from the direction of the upper surface 41A of the semiconductor substrate 41. Thus, the first conductivity type impurity diffusion layer 35, which is higher than the impurity diffusion layer 36 in terms of the impurity concentration, and the first guard rings 24, 25 are simultaneously formed. Thus, the Zener diode 19 is formed which includes: the first conductivity type impurity diffusion layer 35; the impurity diffusion layer 36; and the areas of the semiconductor substrate 41 located under the first conductivity type impurity diffusion layer 35 and the impurity diffusion layer 36.

Specifically, when the impurity diffusion layer 36 is formed such that the p-type impurity concentration is set to about $1.0 \times 10^{17}$ ions/cm$^3$, the first conductivity type impurity diffusion layer 35 and the first guard rings 24, 25 are simultaneously formed by doping the semiconductor substrate with B, from the direction of the upper surface 41A of the semiconductor substrate 41, such that the p-type impurity concentration is set to $1.0 \times_{10}^{18}$ ions/cm$^3$. At this time, the specific depth of the first conductivity type impurity diffusion layer 35 and specific depth of the first guard rings 24, 25 can be set to about 2 μm, for example.

Figure 8:
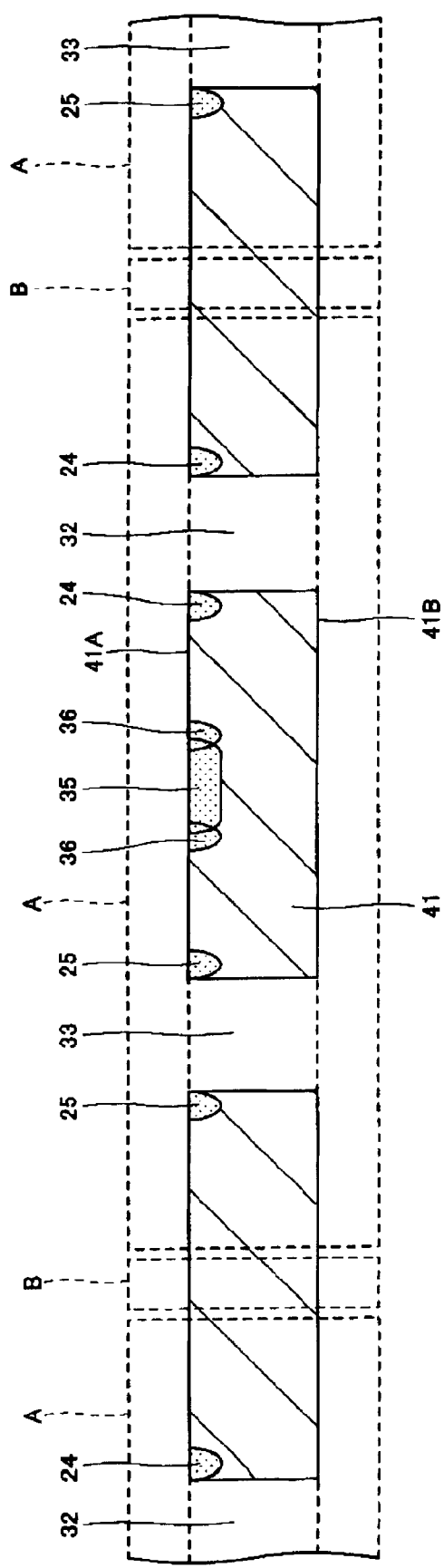
FIG. 8 is a view (part 4) showing a process of manufacturing the wiring board according to the first embodiment of the present invention.

Next, in a process shown in FIG. 8, the through holes 32, 33 are formed in the areas surrounded by the first guard rings 24, 25 so as to penetrate through the semiconductor substrate 41. Specifically, the through holes 32, 33 are formed by means of dry etching such as RIE.

In the process shown in FIG. 8, the through hole 32 penetrating through the semiconductor substrate 41 is formed in the area of the semiconductor substrate 41 surrounded by the first guard ring 24 shaped like a ring when viewed from the top. The through hole 33 penetrating through the semiconductor substrate 41 is also formed in the area of the semiconductor substrate 41 surrounded by the first guard ring 25 shaped like a ring when viewed from the top. Specifically, the through holes 32, 33 are simultaneously formed by means of dry etching, such as RIE.

Figure 9:
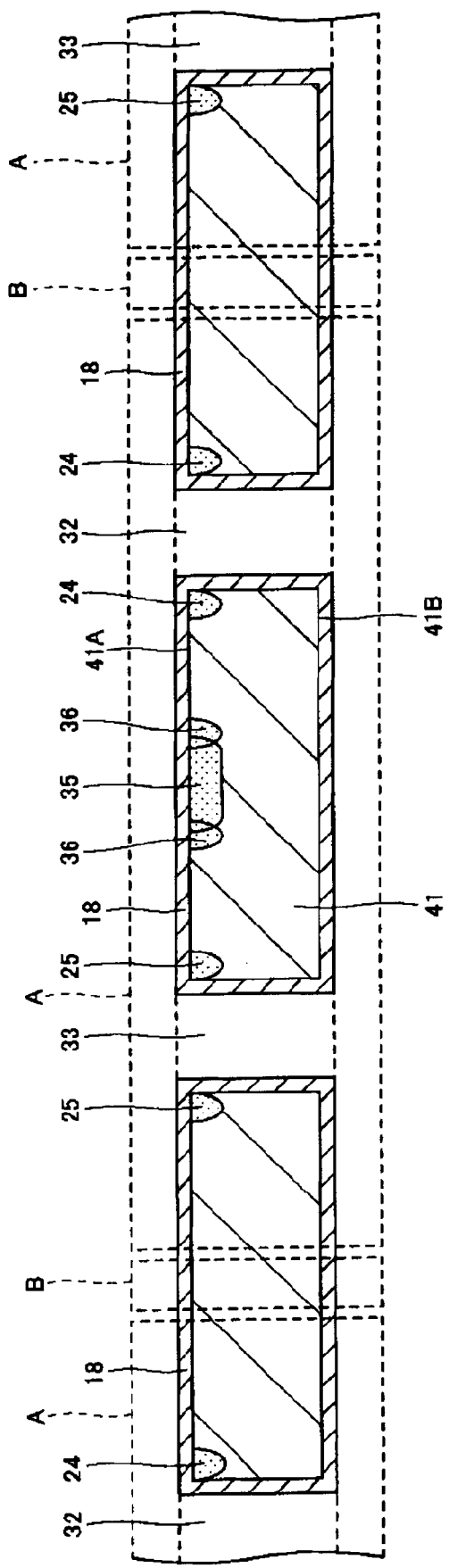
FIG. 9 is a view (part 5) showing a process of manufacturing the wiring board according to the first embodiment of the present invention.

In the process shown in FIG. 9, the insulating film 18 is formed so as to cover the entire surfaces of the semiconductor substrate 41 including both surfaces 41A, 41B of the semiconductor substrate 41 and the surfaces of the semiconductor substrate 41 exposed through the through holes 32, 33. The insulating film 18 is formed by performing thermal oxidation on the semiconductor substrate 41 shown in FIG. 8, for example. Also, an oxide film or a nitride film formed by another means may also be used as the insulating film 18.

Figure 10:
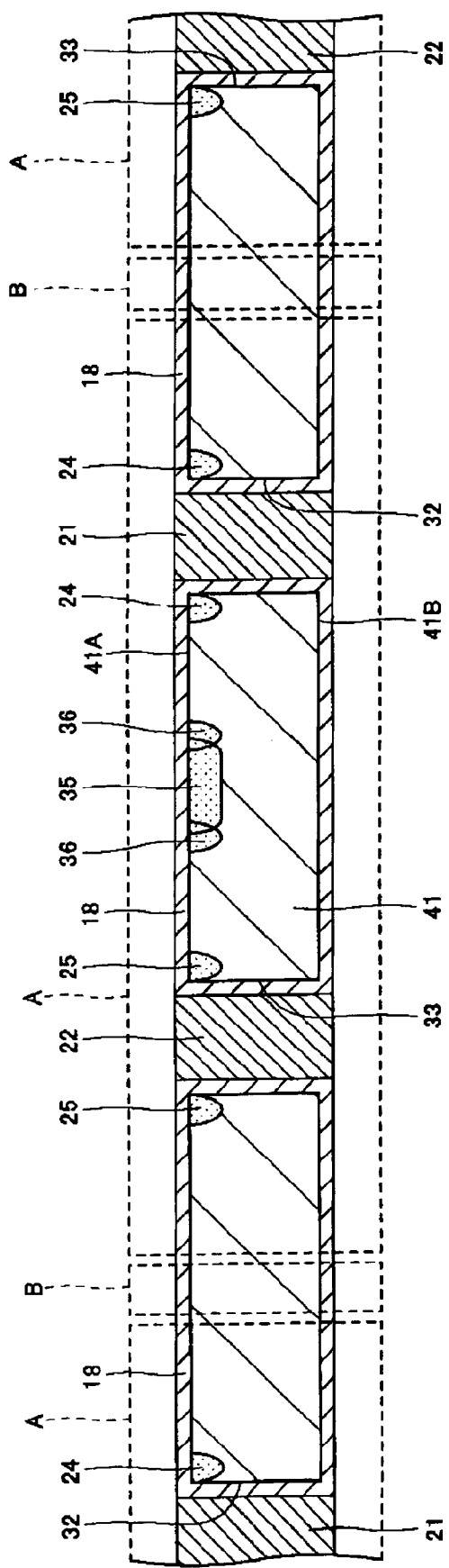
FIG. 10 is a view (part 6) showing a process of manufacturing the wiring board according to the first embodiment of the present invention.

Next, in the process shown in FIG. 10, the through electrodes 21, 22 are formed in the through holes 32, 33 of the semiconductor substrate 41 covered with the insulating film 18. The through electrodes 21, 22 are formed by plating, for example. When the plating technique is employed, Cu may be used as a metallic material constituting the through electrodes 21, 22.

Figure 11:
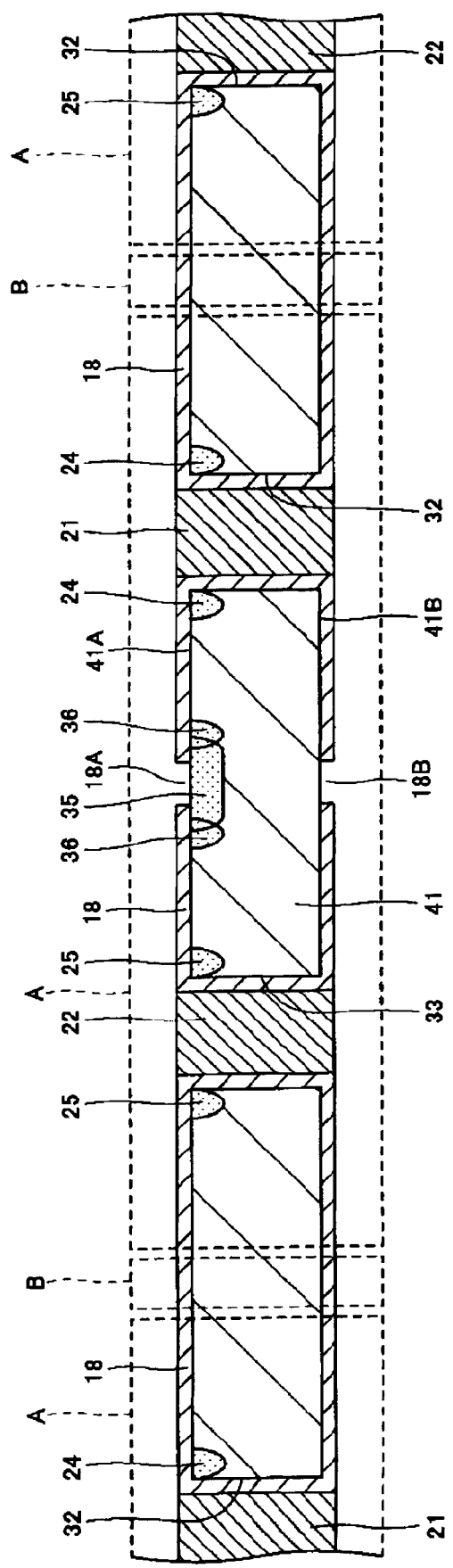
FIG. 11 is a view (part 7) showing a process of manufacturing the wiring board according to the first embodiment of the present invention.

In a process shown in FIG. 11, the opening 18A through which a portion of the first conductivity type impurity diffusion layer 35 is exposed is formed in the area of the insulating film 18 formed on the upper surface 41A of the semiconductor substrate 41. The opening 18B through which a portion of the lower surface 41B of the semiconductor substrate 41 is exposed is formed in the area of the insulating film 18 formed on the lower surface 41B of the semiconductor substrate 41.

Figure 12:
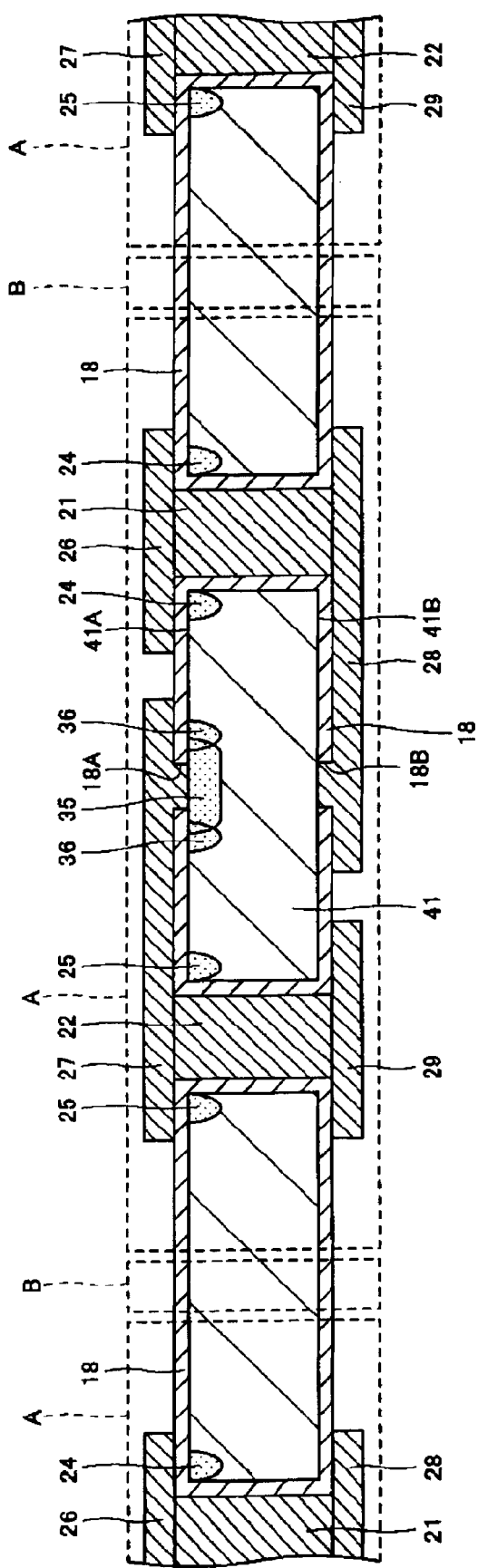
FIG. 12 is a view (part 8) showing a process of manufacturing the wiring board according to the first embodiment of the present invention.

In a process shown in FIG. 12, the wirings 26, 27 are formed on the area of the insulating film 18 formed on the upper surface 41A of the semiconductor substrate 41, and the wirings 28, 29 are formed on the lower surface of the insulating film 18 formed on the lower surface 41B of the semiconductor substrate 41. Structures equivalent to the wiring boards 10 shown in FIG. 2 are hereby formed in the wiring board formation regions A of the semiconductor substrate 41. Specifically, for instance, a Ti—Cu—Ni—Au multilayer film can be used as the composite conductor film constituting the wirings 26 to 29. The Ti—Cu—Ni—Au multilayer film is formed by sequentially layering a Ti film deposited on the surface of the insulating film 18 (the surface of the insulating film 18, the surface of the first conductivity type impurity diffusion layer 35 in the opening 18A, and the surface of the semiconductor substrate 17 in the opening 18B), a Cu film deposited on the surface of the Ti film, a Ni film covering the surface of the Cu film, and an Au film for surface protection covering the surface of the Ni film (the surface of the Cu film), for example.

Figure 13:
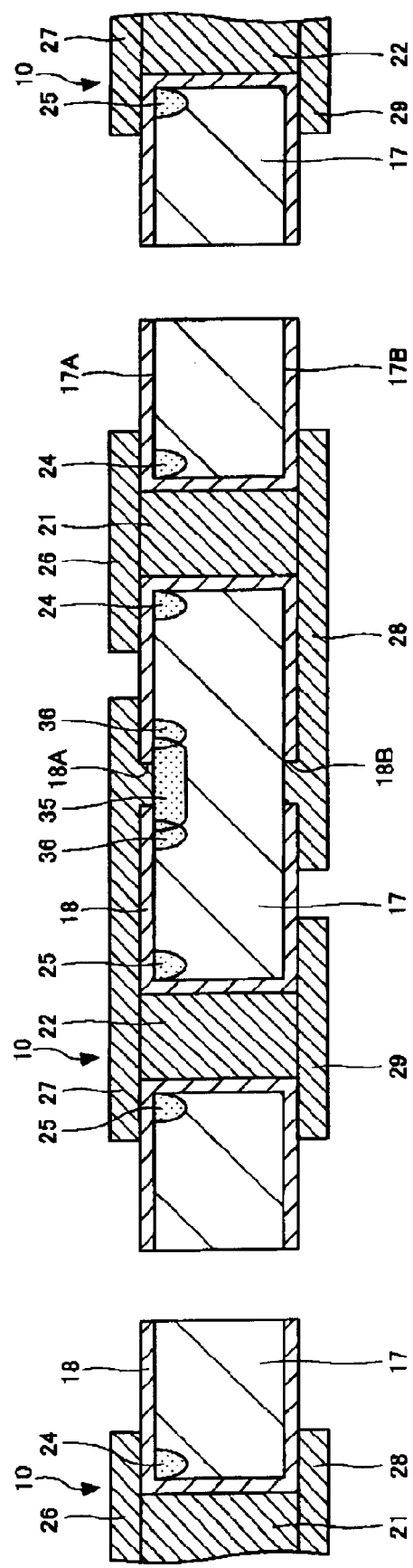
FIG. 13 is a view (part 9) showing a process of manufacturing the wiring board according to the first embodiment of the present invention.

In a process shown in FIG. 13, the insulating film 18 and the semiconductor substrate 41 are cut along the cutoff region B. A plurality of wiring boards 10 are hereby obtained from a single semiconductor substrate 41. For instance, a dicing blade may be used for cutting the insulating film 18 and the semiconductor substrate 41.

According to the method of manufacturing a wiring board in the present embodiment, the first conductivity type impurity diffusion layer 35 and the first guard rings 24, 25 are simultaneously formed, whereby the first guard rings 24, 25 can be formed without an increase in the number of processes of manufacturing the wiring board 10.

While the present embodiment has been described by reference to a case where an n-type silicon substrate (a thickness of about 200 μm, for example) formed by doping monocrystal silicon with a dopant As such that the n-type impurity concentration is set to $1.0 \times 10^{18}$ ions/cm$^3$ is used as the semiconductor substrate 41, an n-type silicon substrate doped with P or Sb can also be used as the semiconductor substrate 41.

A p-type silicon substrate formed by doping monocrystal silicon with B such that the p-type impurity concentration is set to about $1.0 \times 10^{18}$ ions/cm$^3$ can also be used as the semiconductor substrate 41. When the semiconductor substrate 41 is a p-type silicon substrate, the impurity diffusion layer 36 is formed in the process shown in FIG. 6 by doping the substrate with a dopant P, As, or Sb, from the direction of the upper surface 41A of the semiconductor substrate 41, such that the n-type impurity concentration is set to about $1.0 \times 10^{17}$ ions/cm$^3$.

The first conductivity type impurity diffusion layer 35 and the first guard rings 24, 25 are simultaneously formed in the process shown in FIG. 7, which has been previously described, by doping the substrate with the same conductivity type impurity as that of the impurity diffusion layer 36, from the direction of the upper surface 41A of the semiconductor substrate 41, in such that the impurity concentration is set higher than that of the impurity diffusion layer 36. Specifically, in the case where the n-type impurity concentration in the impurity diffusion layer 36 is about $1.0 \times 10^{17}$ ions/cm$^3$, the first conductivity type impurity diffusion layer 35 and the first guard rings 24, 25 are simultaneously formed by doping the substrate with a dopant P, As, or Sb such that the n-type impurity concentration is set to about $1.0 \times 10^{18}$ ions/cm$^3$.

Even if either of an n-type silicon substrate or a p-type silicon substrate is selected as the semiconductor substrate 41, the impurity concentration of the semiconductor substrate 41 may also be higher than $1.0 \times 10^{18}$ ions/cm$^3$.

The impurity concentration of the first conductivity type impurity diffusion layer 35 and the impurity concentration of the first guard rings 24, 25 may also be higher than $1.0 \times 10^{18}$ ions/cm$^3$. The impurity concentration of the impurity diffusion layer 36 may also be higher than $1.0 \times 10^{17}$ ions/cm$^3$ as long as the impurity concentration is lower than that of the first conductivity type impurity diffusion layer 35.

Even if either of an n-type silicon substrate or a p-type silicon substrate is selected as the semiconductor substrate 41, the wiring boards 10 can be manufactured by means of a technique similar to the processes shown in FIGS. 5 through 13 previously described, since only impurity used for doping is different from each other.

Second Embodiment

Figure 14:
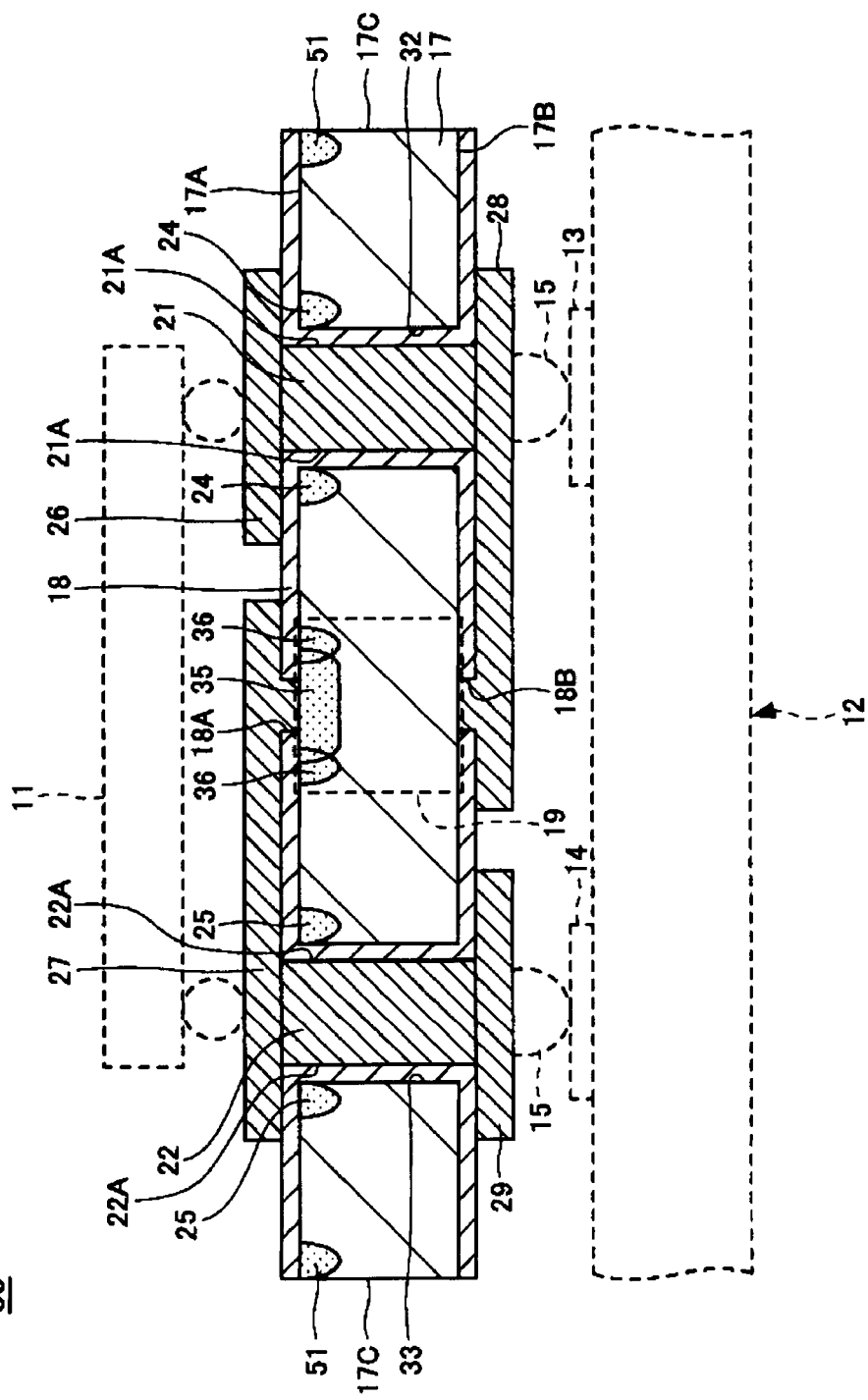
FIG. 14 is a cross-sectional view of a wiring board according to a second embodiment of the present invention.

FIG. 14 is a cross-sectional view of a wiring board according to a second embodiment of the present invention. In FIG. 14, constituent elements identical with those of the structure shown in FIG. 2 are assigned the same reference numerals.

By reference to FIG. 14, a wiring board 50 of the second embodiment is configured almost in the same manner as the wiring board 10 of the first embodiment (see FIG. 2) except that a second guard ring 51 is provided.

The second guard ring 51 is formed in frame shape on the upper surface 17A of the semiconductor substrate 17 to surround the first conductivity type impurity diffusion layer 35, the impurity diffusion layer 36, the through electrodes 21 and 22, and the first guard rings 24 and 25. Specifically, the second guard ring 51 is formed along the side surface 17C of the semiconductor substrate 17 and hereby positioned so as to surround the first conductivity type impurity diffusion layer 35, the impurity diffusion layer 36, the through electrodes 21 and 22, and the first guard rings 24 and 25.

The second guard ring 51 is formed by doping the semiconductor substrate with a p-type impurity or an n-type impurity, from the direction of the upper surface 17A of the semiconductor substrate 17. The conductivity type and impurity concentration of the second guard ring 51 are preferably set equal to those of the first guard ring 25 or those of the first conductivity type impurity diffusion layer 35 so that the second guard ring can be formed simultaneously with the first guard ring 25 or the first conductivity type impurity diffusion layer 35. When the second guard ring 51 is formed simultaneously with the first guard ring 25 or the first conductivity type impurity diffusion layer 35, the depth of the second guard ring 51 becomes almost equal to the depth of the first guard ring 25 or the first conductivity type impurity diffusion layer 35. Specifically, when the depth of the first guard ring 25 or the depth of the first conductivity type impurity diffusion layer 35 is set to 2 μm, the depth of the second guard ring 51 can be set to 2 μm, for example.

By providing the second guard ring 51 configured as mentioned above, the majority of contaminants (e.g., Fe, Na, K, Cu, and the like) intruded into the semiconductor substrate 17 from the outside by way of the side surface 17C of the semiconductor substrate 17 are captured by the second guard ring 51 by means of gettering. For this reason, even when contaminants (e.g., Na, K, Cu, and the like) are intruded into the semiconductor substrate 17 by way of the side surface 17C thereof when the wiring boards 50 are separated into pieces by a dicing blade, diffusion of the contaminants to the formation area of the Zener diodes 19 is prevented, so that characteristic deterioration of the Zener diodes 19 can be prevented.

According to the wiring boards in the present embodiment, characteristic deterioration of the Zener diodes 19 induced by the contaminants (e.g., Fe, Na, K, Cu, and the like) intruded from the outside into the semiconductor substrate 17 can be prevented.

Figure 15:
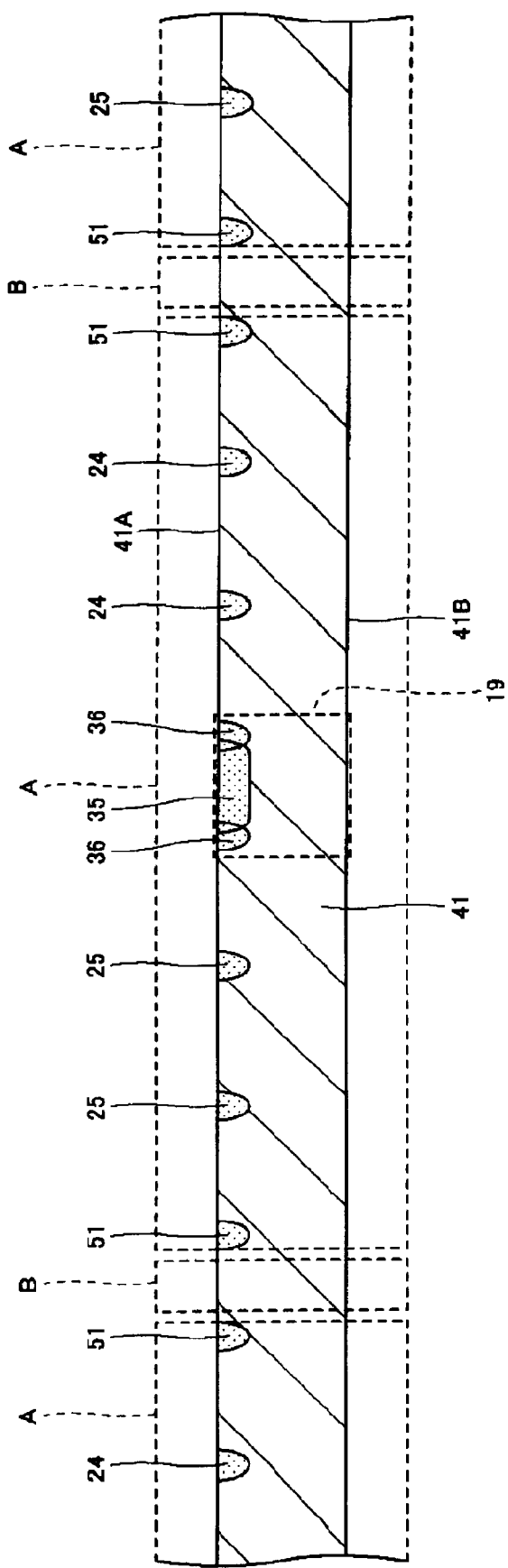
FIG. 15 is a view (part 1) showing a process of manufacturing the wiring board according to the second embodiment of the present invention.
Figure 16:
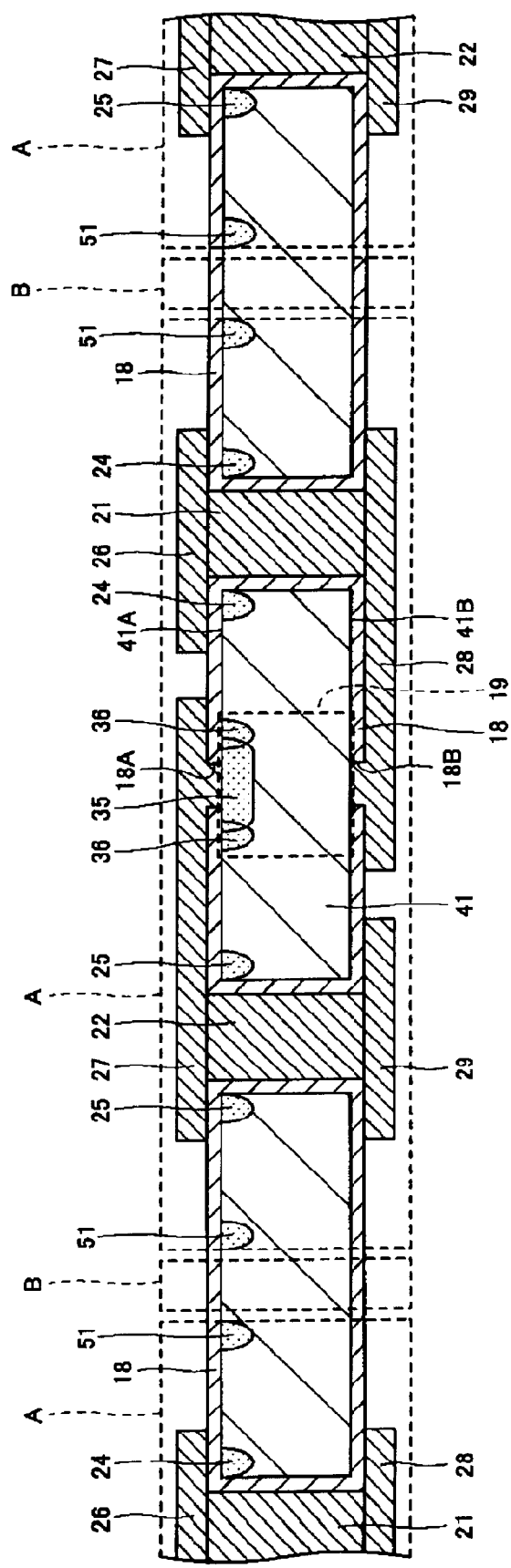
FIG. 16 is a view (part 2) showing a process of manufacturing the wiring board according to the second embodiment of the present invention.
Figure 17:
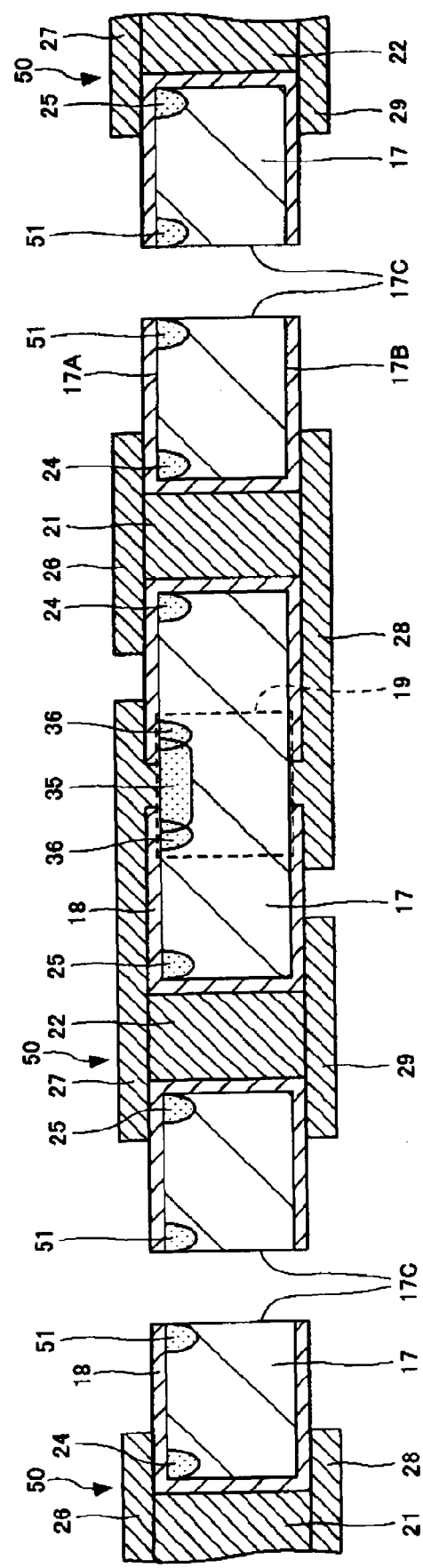
FIG. 17 is a view (part 3) showing a process of manufacturing the wiring board according to the second embodiment of the present invention.

FIGS. 15 through 17 are views showing processes for manufacturing the wiring board according to the second embodiment of the present invention. In FIGS. 15 through 17, constituent elements identical with those of the wiring board 50 of the present embodiment are assigned the same reference numerals.

In the process shown in FIG. 15, the semiconductor substrate 41 having the impurity diffusion layer 36 is doped with impurity by the same process shown in FIG. 7 that is described in the first embodiment, thereby simultaneously forming the first guard rings 24 and 25, the first conductivity type impurity diffusion layer 35, and the second guard ring 51. At this time, the second guard ring 51 is formed along boundary of the wiring board formation regions A on the semiconductor substrate 41, and the shape of the second guard ring 51 is a frame when viewed from the top face.

As described above, the first guard rings 24 and 25, the first conductivity type impurity diffusion layer 35, the second guard ring 51 are simultaneously formed in the semiconductor substrate 41, so that the first and second guard rings 24, 25, and 51 can be formed without an increase in the number of processes of manufacturing the wiring boards 50. Thus, the manufacturing cost of the wiring boards 50 can be reduced.

In a process shown in FIG. 16, through the same processes as those shown in FIGS. 8 through 12 in the first embodiment, structures corresponding to the wiring boards 50 are formed in the plurality of wiring board formation regions A.

In a process shown in FIG. 17, the insulating film 18 and the semiconductor substrate 41 are cut in the cutoff region B shown in FIG. 16, whereby the single semiconductor substrate 41 is divided into the plurality of wiring boards 50. For example, a dicing blade may be used for cutting the insulating film 18 and the semiconductor substrate 41.

According to the method of manufacturing a wiring board in the present embodiment, the second guard rings 51, each formed into a frame when viewed from the above, are formed near the boundaries of the wiring board formation regions A of the semiconductor substrate 41, thereby preventing the contaminants (e.g., Fe, Na, K, Cu, and the like) intruding from the cut surface (the side surface 17C) of the semiconductor substrate 17 from reaching the formation area of the Zener diodes 19. Hence, characteristic deterioration of the Zener diodes 19, which is caused by the contaminants, can be prevented. Further, the first guard rings 24 and 25, the impurity diffusion layer 36, and the second guard rings 51 are simultaneously formed, so that the first and second guard rings 24, 25, and 51 can be formed without an increase in the number of processes for manufacturing the wiring boards 50.

The present invention is applicable to a re-wiring board that electrically connects a mounting board (a mother board) to the electronic components and includes semiconductor elements provided in a semiconductor substrate and electrically connected to electronic components.

While the present invention has been shown and described with reference to certain exemplary embodiments thereof, it will be understood by those skilled in the art that various changes in form and details may be made therein without departing from the spirit and scope of the invention as defined by the appended claims. It is aimed therefore, to cover in the appended claim all such changes and modifications as fall within the true spirit and scope of the present invention.

What is claimed is:

1. A wiring board comprising:
    a semiconductor substrate having a through hole and covered with an insulating film;
    a through electrode formed in the through hole;
    a first wiring connected to one end of the through electrode; and
    a second wiring connected to the other end of the through electrode,
    wherein the semiconductor substrate comprises:
        a semiconductor element including a first conductivity-type impurity diffusion layer having a different conductivity-type from that of the semiconductor substrate and electrically connected to the first wiring and the second wiring;
        a first guard ring formed to surround the through hole; and
        a second guard ring formed to surround the first conductivity-type impurity diffusion layer, the semiconductor element, the through electrode and the first guard ring,
        wherein the semiconductor element, the first guard ring, and the second guard ring are embedded in the semiconductor substrate, and
        wherein the second guard ring is formed along side surfaces of the semiconductor substrate on an upper surface side thereof.

2. The wiring board according to claim 1, wherein the semiconductor element is a Zener diode and includes:
    the first conductivity-type impurity diffusion layer;
    a first impurity diffusion layer formed to surround an outer periphery of the first conductivity-type impurity diffusion layer, wherein the first impurity diffusion layer has the same conductivity type as that of the first conductivity-type impurity diffusion layer and is lower than the first conductivity-type impurity diffusion layer in terms of an impurity concentration; and
    a portion of the semiconductor substrate positioned under the first conductivity-type impurity diffusion layer.

3. The wiring board according to claim 2, wherein the semiconductor substrate is a silicon substrate having a low impurity concentration in which an inversion layer is formed by a potential difference between the through electrode and the semiconductor substrate when applying power, and
    wherein the first guard ring is formed from a second impurity diffusion layer having the same conductivity type as that of the semiconductor substrate and being higher than the semiconductor substrate in terms of an impurity concentration.

4. The wiring board according to claim 2, wherein the semiconductor substrate is a silicon substrate having a high impurity concentration in which an inversion layer is unlikely to be formed by a potential difference between the through electrode and the semiconductor substrate when applying power, and
    the first guard ring is formed from a second impurity diffusion layer having a different conductivity type from that of the semiconductor substrate.

5. The wiring board according to claim 4, wherein the second impurity diffusion layer has the same conductivity type as that of the first conductivity-type impurity diffusion layer and has almost the same impurity concentration as that of the first conductivity-type impurity diffusion layer.

6. The wiring board according to claim 1, wherein the second guard ring is shaped like a frame in a plan view.

7. The wiring board according to claim 6, wherein the second guard ring is formed from a third impurity diffusion layer having the same conductivity type as that of the first guard ring and having almost the same impurity concentration as that of the second impurity diffusion layer.

8. A semiconductor device comprising:
- a wiring board; and
- an electronic component mounted on the wiring board,
- wherein the wiring board comprises:
    - a semiconductor substrate having a through hole and covered with an insulating film;
    - a through electrode formed in the through hole;
    - a first wiring connected to one end of the through electrode; and
    - a second wiring connected to the other end of the through electrode,
- wherein the semiconductor substrate comprises:
    - a semiconductor element including a first conductivity-type impurity diffusion layer having a different conductivity-type from that of the semiconductor substrate and electrically connected to the first wiring and the second wiring;
    - a first guard ring formed to surround the through hole; and
    - a second guard ring shaped like a frame in a plan view and being formed to surround the first conductivity-type impurity diffusion layer, the semiconductor element, the through electrode and the first guard ring,
- wherein the semiconductor element, the first guard ring, and the second guard ring are embedded in the semiconductor substrate, and
- wherein the second guard ring is formed along side surfaces of the semiconductor substrate on an upper surface side thereof.

9. The wiring board according to claim 1, wherein the depth of the second guard ring is almost equal to the depth of the first guard ring.

10. The semiconductor device according to claim 8, wherein the semiconductor element is connected in parallel to the electronic component.

* * * * *